US011063467B2

(12) United States Patent
Stevens et al.

(10) Patent No.: US 11,063,467 B2
(45) Date of Patent: Jul. 13, 2021

(54) POWER DELIVERY MONITOR AND CONTROL WITH AN UNINTERRUPTIBLE POWER SUPPLY

(71) Applicant: Hewlett Packard Enterprise Development LP, Houston, TX (US)

(72) Inventors: Matthew E. Stevens, Houston, TX (US); Derrick G. Runcie, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 259 days.

(21) Appl. No.: 15/752,299

(22) PCT Filed: Aug. 24, 2015

(86) PCT No.: PCT/US2015/046614
§ 371 (c)(1),
(2) Date: Feb. 13, 2018

(87) PCT Pub. No.: WO2017/034545
PCT Pub. Date: Mar. 2, 2017

(65) Prior Publication Data
US 2018/0241244 A1  Aug. 23, 2018

(51) Int. Cl.
*H02J 9/06* (2006.01)
*G01R 19/25* (2006.01)
(Continued)

(52) U.S. Cl.
CPC ............... *H02J 9/06* (2013.01); *G06F 1/30* (2013.01); *H01R 13/6675* (2013.01);
(Continued)

(58) Field of Classification Search
CPC .... H02J 9/06; H02J 13/0003; H01R 13/6675; G06F 1/30; G01R 19/2513; Y04S 20/18; Y04S 20/12; Y02B 90/228; Y02B 90/222
See application file for complete search history.

(56) References Cited

U.S. PATENT DOCUMENTS 6,826,036 B2   11/2004 Pereira
7,158,382 B2   1/2007 Fan
(Continued)

FOREIGN PATENT DOCUMENTS

JP    2004015455       1/2004
JP    2005018384 A  *  1/2005
(Continued)

OTHER PUBLICATIONS

Translation for JP 2005018384 (Year: 2005).*
(Continued)

*Primary Examiner* — Rexford N Barnie
*Assistant Examiner* — Elim Ortiz
(74) *Attorney, Agent, or Firm* — Hewlett Packard Enterprise Patent Department

(57) ABSTRACT

Example implementations relate to power delivery monitor and control with an uninterruptible power supply (UPS). For example, a UPS includes a power output receptacle to supply power to a power extension bar coupled to the UPS via a power cable, the extension bar to provide the power to a plurality of computing devices coupled to the extension bar. The UPS also includes a data communication port to couple the UPS to the extension bar via a communication cable, and a controller module to monitor and control power delivered to a plurality of power output receptacles on the extension bar.

20 Claims, 4 Drawing Sheets

(51) Int. Cl.
*G06F 1/30* (2006.01)
*H02J 13/00* (2006.01)
*H01R 13/66* (2006.01)

(52) U.S. Cl.
CPC ...... *H02J 13/0003* (2013.01); *G01R 19/2513* (2013.01); *Y02B 90/20* (2013.01); *Y04S 20/00* (2013.01); *Y04S 20/12* (2013.01)

(56) References Cited

U.S. PATENT DOCUMENTS

| | | | |
|---|---|---|---|
| 7,982,335 | B2 | 7/2011 | Aldag |
| 8,173,898 | B2 | 5/2012 | Rasmussen |
| 8,902,569 | B1 | 12/2014 | Wishman |
| 2011/0140523 | A1 | 6/2011 | Ziegler |
| 2011/0217875 | A1* | 9/2011 | Lee .......... H01R 13/66 439/620.24 |
| 2012/0319485 | A1* | 12/2012 | Ewing .......... H02J 9/06 307/64 |
| 2015/0349846 | A1* | 12/2015 | Hunter .......... H04B 3/56 375/257 |

FOREIGN PATENT DOCUMENTS

JP 2005018384 2/2005
JP 2006245983 9/2006

OTHER PUBLICATIONS

Watts, D.; "1U Switched and Monitored Power Distribution Units," May 13, 2010, 7pps.
Search Report and Written Opinion received for PCT Application No. PCT/US2015/046614, dated May 17, 2016, 9 pages.

* cited by examiner

POWER DELIVERY MONITOR AND CONTROL WITH AN UNINTERRUPTIBLE POWER SUPPLY

BACKGROUND

An uninterruptible power supply (UPS) is a device that is designed to provide electrical power to connected equipment, such as computer servers, when a primary input power source for the connected equipment fails. Certain UPSs are designed to provide near-instantaneous protection from input power interruptions by supplying energy stored in batteries, supercapacitors, or other suitable stored energy sources.

BRIEF DESCRIPTION OF THE DRAWINGS

Some examples of the present application are described with respect to the following figures.

DETAILED DESCRIPTION

Figure 1:
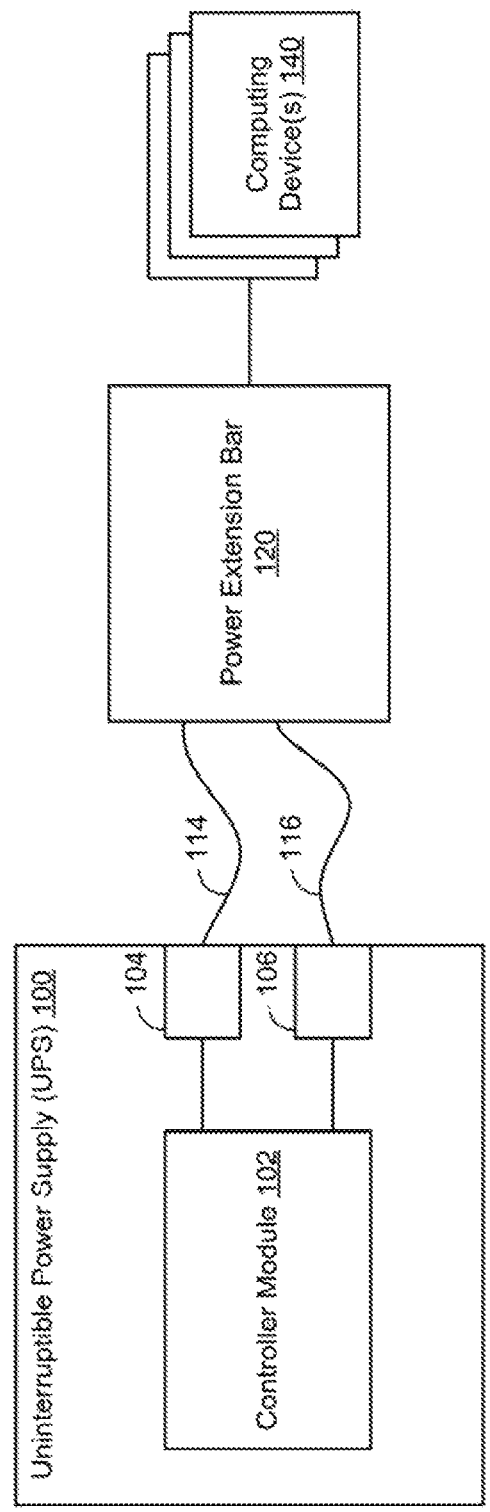
FIG. 1 is a block diagram of an example uninterruptible power supply (UPS) to monitor and control power delivery.

As described above, a UPS can be used to protect hardware such as computers, data centers, telecommunication equipment or other electrical equipment where unexpected power disruption could cause injuries, business disruption, or data loss. Conventional UPSs include power output receptacles (or power outlet), for example on a back side of the UPS, to provide power to a plurality of power extension bars (or power outlet strips), which in turn provide the power to computing devices attached to the extension bars. However, the power receptacles of the UPS do not have power monitoring and switching capabilities or communication channels to the extension bar to enable the transfer of power consumption information and control signals such that the UPS can remotely turn on and off power at each receptacle, and in turn at each device connected to the extension bar.

Examples described herein address the above need by providing a data communication port on the UPS, in addition to the power output receptacles, to enable the UPS to monitor and control power delivered to the power extension bar and to the plurality of devices coupled to the extension bar. As described herein, the UPS can use a standard power cable to couple the UPS to extension bar to deliver power and a standard communication cable to couple the UPS to the extension bar to communicate data and control signals to the extension bar. By providing the UPS with additional features to monitor and control power delivered to the extension bar, a customer may not need to purchase a separate managed power distribution unit (PDU) that uses a separate PDU firmware, thereby providing useful electronic features of a PDU in the UPS. Moreover, the described examples allow vendors to shift their focus on increasing or improving temperature ratings on the extension bars since certain PDU features can be made available in the UPS which is installed in the rack and cooled by air from the cool aisle (i.e., front of the rack), whereas extension bars are installed in the back of the rack (i.e., hot aisle). Further, the described examples provide a cost effective solution for monitoring and controlling power delivery by a UPS by using standard power cables (e.g., C19 and C13) and communication cables (e.g., Cat 5) for power delivery and data communication, respectively, with the extension bar.

In one example, an uninterruptible power supply (UPS) includes a power output receptacle to supply power to a power extension bar coupled to the UPS via a power cable, the extension bar to provide the power to a plurality of computing devices coupled to the extension bar. The UPS also includes a data communication port to couple the UPS to the extension bar via a communication module, and a controller module to monitor and control power delivered to a plurality of power output receptacles on the extension bar.

In another example, a method includes coupling an uninterruptible power supply (UPS) to a power outlet strip using a power cable. The method includes coupling the UPS to the power outlet strip using a communication cable. The method also includes and monitoring and controlling, using a controller module of the UPS, power delivered to each power output receptacle of the power outlet strip.

In another example, an uninterruptible power supply includes a power outlet to receive a power cable to supply power to a power extension bar coupled to the UPS, where the extension bar is to provide power to a plurality of computing devices attached to the extension bar. The UPS includes a data communication port to receive a communication cable coupled to the extension bar, where the data communication port is to enable communication with the extension bar via the communication cable. The UPS also includes a controller module that includes a processing resource and a memory resource, where the memory resource stores non-transitory machine-readable instructions executable by the processing resource to monitor and control power delivered to each power output receptacle of the extension bar.

Referring now to the figures, FIG. 1 is a block diagram of an example uninterruptible power supply (UPS) to monitor and control power delivery. UPS 100 can, for example, provide electrical power to a connected equipment such as power extension bar 120 (or power outlet strip or power strip) which in turn provides the power to attached computing devices 140, when a primary input source for the connected equipment fails. UPS 100 can be designed to operate based on power management instructions received from a remote computer or a management computer system (not shown) in communication with the UPS over a wired or wireless communication link UPS 100 can, for example, be in the form of a standalone UPS appliance. In some examples, UPS 100 can be integrated within a general purpose computer or other equipment for managing the UPS.

UPS 100 provides electrical power to extension bar 120 through a power cable 114. Extension bar 120 includes a number of power outlets to which various devices 140 can be coupled. Power cable 114 is coupled to a power output receptacle 104 of the UPS and to a corresponding receptacle or power outlet of the extension bar 120. For example, receptacle 104 may be an International Electrotechnical Commission (IEC) standard C19 or C13 connector to receive a C19 or C13 power cable that is connected to a corresponding receptacle on the extension bar 120.

Data communication between the UPS 100 and the extension bar 120 is accomplished through a communication port 106 of the UPS 100. Communication cable 116 is coupled to the port 106 of the UPS and to a corresponding port of the extension bar 120. For example, port 106 can be a standard communication port such as a serial port, an Ethernet port, an optical port, or a registered jack (RJ) port to receive a corresponding serial cable, Ethernet cable, optical cable, twisted pair cable, or an RJ cable, to connect to the extension bar 120. To illustrate, port 106 can be, for example, a standard category 5 (cat 5) cable, for communicatively coupling the UPS 100 to the extension bar 120.

UPS 100 includes a controller module 102. Controller module 102 can include hardware and/or software to monitor and control power delivered to the extension bar 120 (and to the devices 140). For example, controller module 102 controller module 102 can include a general purpose processor, an application specific integrated circuit (ASIC), a field programmable gate array (FPGA), microcontroller, and others. Controller module 102 can be coupled to the power output receptacle 104 and to the data communication port 106. Data communication between the UPS 100 and the extension bar 120 enables the controller module 102 to receive monitoring information from the extension bar 120 and to send instructions or commands to the extension bar 120. For example, the extension bar 120 may include circuitry for monitoring the level of power being consumed at each of the receptacle or power outlet of the extension bar 120 at any time. Controller module 102 can collect this information through the data port 106. Controller module 102 can also use the data port 106 to communicate commands to the extension bar 120. For example, the extension bar 120 may include circuitry that enables it to switch selected receptacles or power outlets on or off. Thus, controller module 102 can send commands through the data port 106 that will cause the extension bar 120 to switch selected power outlets of the extension bar 120 on or off, which in turn switches power to selected devices 140 on or off. Various other commands and data can be communicated between the UPS 100 and the extension bar 120.

As described above, the UPS 100 can also be communicatively coupled to a management computing device (not shown). The computing device enables a user to, remotely, monitor and control power delivery to the extension bar 120 and to the devices 140 through the UPS 100. For example, monitored information received from the extension bar 120 can be sent to the management computing device, and the user can turn specified power outlets of the extension bar 120 on or off by sending commands to the UPS 100. The UPS can be coupled to the management computing device through a direct connection or through a network, which may be a local area network (LAN), wide area network (WAN), storage area network (SAN), or other suitable type of network.

In some examples, the UPS 100 can be connected to a plurality of extension bars 120 via respective power cables and respective communication cables, as described above. Further, each extension bar 120 can support multiple computing devices 140. Accordingly, UPS 100 can monitor and control power delivered to each receptacle of each extension bar 120.

Figure 2:
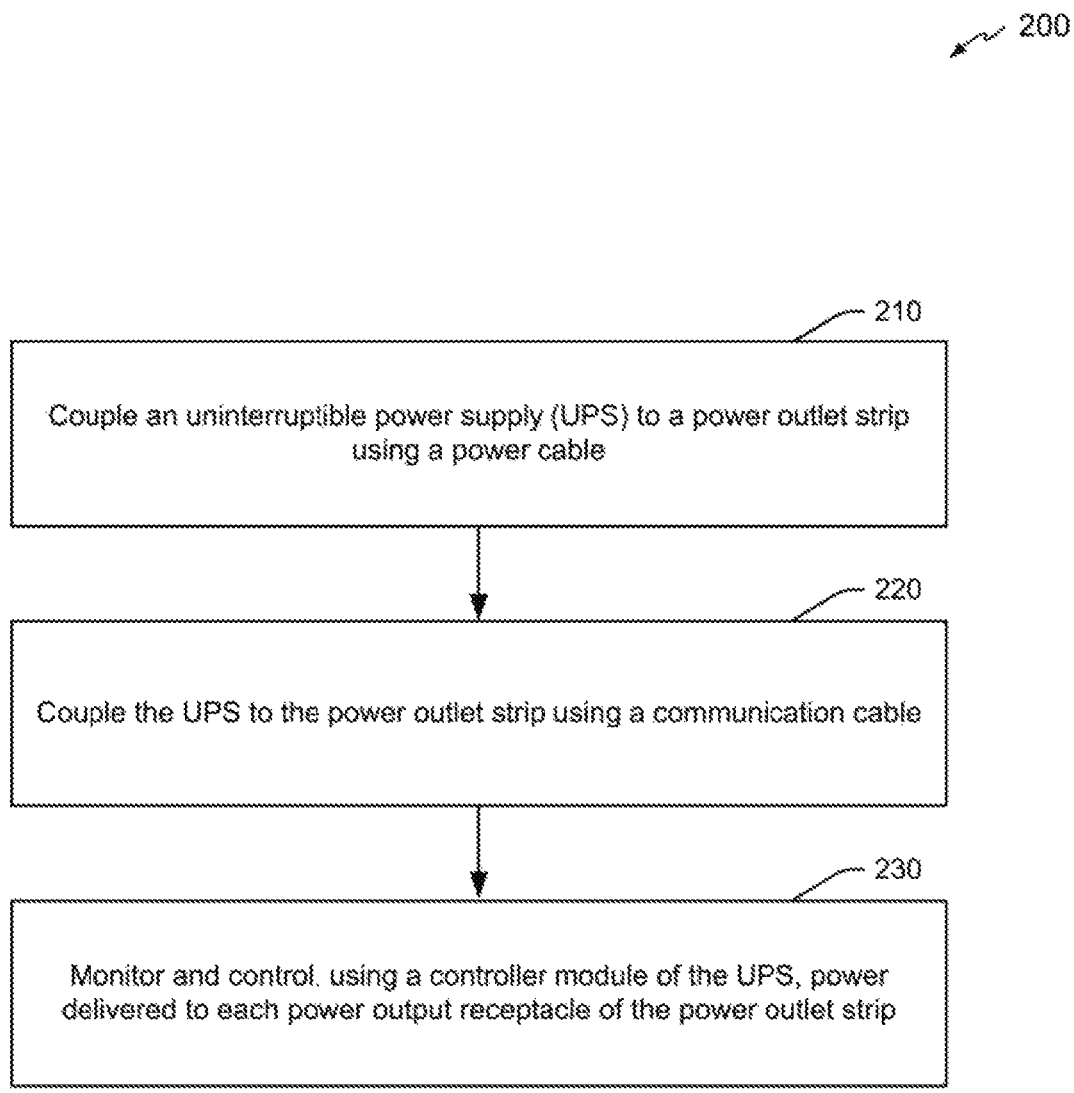
FIG. 2. is a flowchart of an example method for monitoring and controlling power delivery by a UPS.

FIG. 2 is a flowchart of an example method for monitoring and controlling power delivery by a UPS. Although execution of method 200 is described below with reference to device 100 of FIG. 1, other suitable devices for execution of method 200 may be used. Method 200 can be implemented in the form of executable instructions stored on a computer-readable storage medium, such as memory resource 420 of FIG. 4, and/or in the form of electronic circuitry.

Method 200 includes coupling an uninterruptible power supply (UPS) to a power outlet strip using a power cable, at 210. For example, UPS 100 can be coupled to extension bar 120 via power cable 114. Power cable 114 can be a standard power cable such as a C19 or C13 power cable coupled to receptacle 104 of the UPS 100 and to a corresponding receptacle on the extension bar 120.

Method 200 includes coupling the UPS to the power outlet strip using a communication cable, at 220. For example, the UPS 100 can be coupled to the extension bar 120 via a communication cable 116. Communication cable 116 can be a standard data cable such as a cat 5 cable coupled to the communication port 106 of the UPS and a corresponding port of the extension bar 120.

Method 200 includes monitoring and controlling, using a controller module of the UPS, power delivered to each power output receptacle of the power outlet strip, at 230. For example, controller module 102 can receive power consumption information from the extension bar 120 and can selectively switch on or off power delivered to each receptacle of the extension bar 120. In some examples, the method 200 of FIG. 2 includes additional steps in addition to and/or in lieu of those depicted in FIG. 2.

Figure 3:
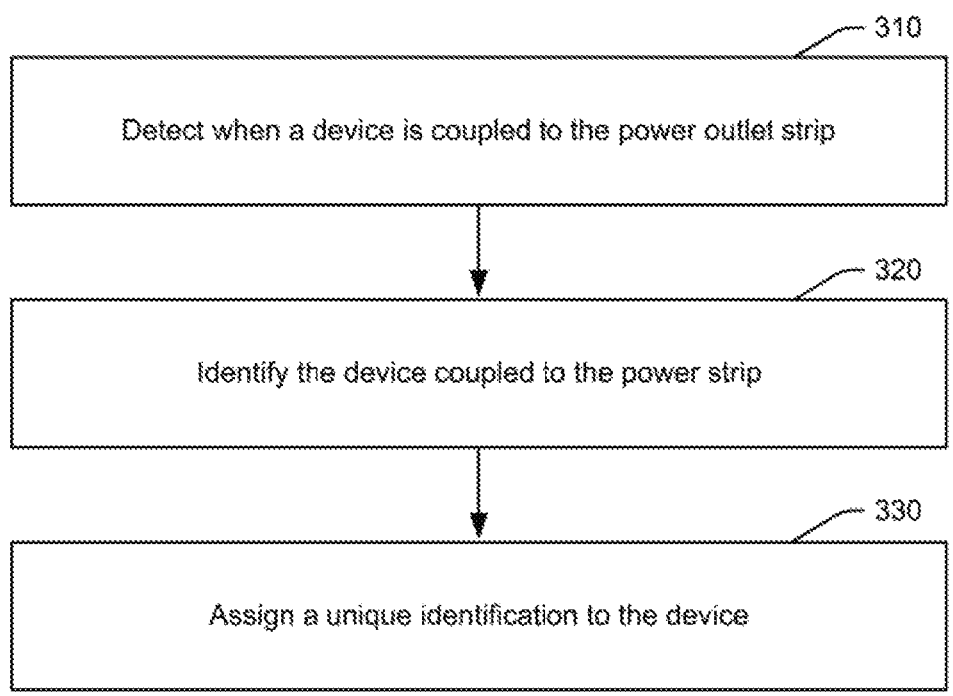
FIG. 3 is a flowchart of an example method for monitoring and controlling power delivery by a UPS.

FIG. 3 is a flowchart of an example method for monitoring and controlling power delivery by a UPS. Although execution of method 300 is described below with reference to device 100 of FIG. 1, other suitable devices for execution of method 300 may be used. Method 300 can be implemented in the form of executable instructions stored on a computer-readable storage medium, such as memory resource 420 of FIG. 4, and/or in the form of electronic circuitry.

Method 300 includes detecting when a device is coupled to the power outlet strip, at 310. For example, controller module 102 of the UPS can detect when a device of the plurality of devices 140 is connected to a particular receptacle of a plurality of receptacles of the extension bar 120. The detection can be triggered when the device is receiving power from the UPS 100 (i.e., via the extension bar 120).

Method 300 includes identifying the device coupled to the power strip, at 320. For example, controller module 102 can identify a type of the device 140 coupled to the extension bar. For instance, the device 140 can be identified as a server computer, a networking device, a storage device, etc.

Method 300 includes assigning a unique identification to the device, at 330. For example, to enable the controller module 102 to monitor and control power delivery to a plurality of devices 140 coupled to the extension bar 120, each receptacle or outlet of the extension bar (or devices connected thereto) is assigned a unique identifier. The unique identifier, may be used in all data communications between the PDU and the extension bar 120. The unique identifier can be assigned during a configuration process, which may be triggered upon addition or removal of an extension bar 120 or a device 140. In other examples, the configuration process can also be triggered in response to a reset command received from an administrator. In certain examples, the receptacles of the extension bar 120 or devices 140 can be configured, such that during the configuration process, each receptacle or device assigns a unique identifier to itself and declares the unique identifier to the UPS 100. The self-assignment can be based on the devices' position on the receptacle of the extension bar 120. In some examples, the method 300 of FIG. 3 includes additional steps in addition to and/or in lieu of those depicted in FIG. 3.

Figure 4:
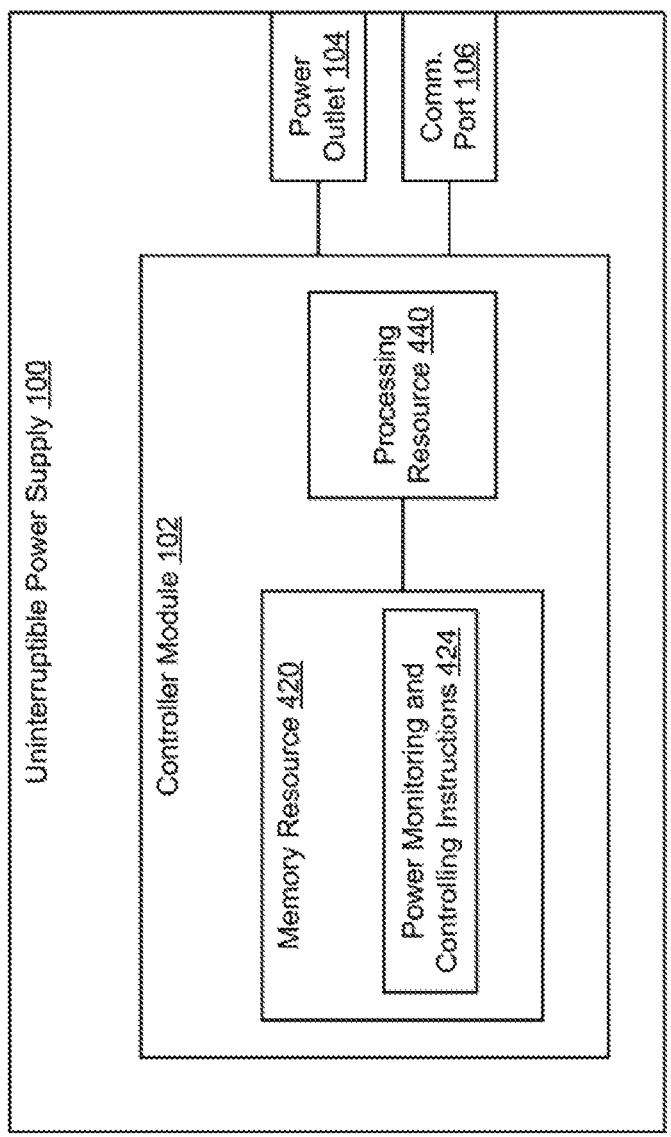
FIG. 4 is a block diagram of a UPS including machine-readable instructions to monitor and control power delivery by the UPS.

FIG. 4 is a block diagram of a block diagram of a UPS including machine-readable instructions to monitor and control power delivery by the UPS. UPS 100 includes a power outlet 104 and a communication port 106 coupled to a controller module 102. Controller module 102 includes a processing resource 440 and a memory resource 420 that stores non-transitory machine-readable instructions 424.

UPS 100 can be any suitable form or size. UPS 100 can be, for example, in the form of a standalone tower UPS, a rack-mountable UPS, or designed to be placed inside a computer chassis. Power outlet 104 (or power receptacle) is provided to receive power cable 114 (e.g., standard IEC C13 or C19 power cable) to supply power to extension bar 120. Power outlet 104 can be in electrical or other form of communication with controller module 102 to allow controller module 102 to control power delivery to the extension bar 120. In some examples, power cable 114 can include a power plug that can be removably plugged into power outlet 104. It is appreciated that power outlet 104 can be designed to receive other forms of removable or irremovable power cables. Communication port 106 is provided to receive communication cable 116 (e.g., cat 5 cable) to enable data communication between the UPS and the extension bar 120. In some examples, communication cable 116 can be removably or irremovably coupled to the UPS 100. Further, communication port 106 can enable controller module 102 to send commands to the extension bar 120, such as commands to selectively enable or disable power at a particular receptacle of the extension bar 120.

Processing resource 440 can be one or more central processing units (CPUs), microprocessors, and/or other hardware devices suitable for retrieval and execution of instructions stored in memory resource 420. Processing resource 440 may fetch, decode, and execute instructions 424 to enable monitoring and controlling power delivery, as described below. As an alternative or in addition to retrieving and executing instructions, processing resource 440 may include one or more electronic circuits comprising a number of electronic components for performing the functionality of instructions 424.

Memory resource 420 may be any electronic, magnetic, optical, or other physical storage device that stores executable instructions. Memory resource 420 can be a computer-readable storage medium and may be, for example, random access memory (RAM), content addressable memory (CAM), ternary content addressable memory (TCAM), an electrically-erasable programmable read-only memory (EEPROM), flash memory, a storage drive, an optical disc, and the like. As described in detail below, memory resource 420 may be encoded with executable instructions for enabling the UPS 100 to monitor and control power delivered to extension bar 120.

Power monitoring and controlling instructions 424 include instructions to receive monitor and control power delivered to each power output receptacle of the extension bar 120. Instructions 424 include instructions to detect and identify a device coupled to the extension bar. Instructions 424 include instructions to monitor an amount of power consumed by the extension bar 120 and an amount of power consumed by each device 140 coupled to the extension bar 120. Instructions 424 also include instructions to selectively turn on and off power to the extension bar 120 and to each device 140.

The techniques described above may be embodied in a computer-readable medium for configuring a computing system to execute the method. The computer-readable media may include, for example and without limitation, any number of the following non-transitive mediums: magnetic storage media including disk and tape storage media; optical storage media such as compact disk media (e.g., CD-ROM, CD-R, etc.) and digital video disk storage media; holographic memory; nonvolatile memory storage media including semiconductor-based memory units such as FLASH memory, EEPROM, EPROM, ROM; ferromagnetic digital memories; volatile storage media including registers, buffers or caches, main memory, RAM, etc.; and the Internet, just to name a few. Other new and obvious types of computer-readable media may be used to store the software modules discussed herein. Computing systems may be found in many forms including but not limited to mainframes, minicomputers, servers, workstations, personal computers, notepads, personal digital assistants, tablets, smartphones, various wireless devices and embedded systems, just to name a few.

What is claimed is:

1. An uninterruptible power supply (UPS), comprising:
a power output receptacle;
a data communication port; and
a controller module, comprising:
   a processing resource; and
   a memory resource coupled to the processing resource, the memory resource including executable instructions that, when executed by the processing resource, cause the processing resource to:
      monitor power information using the data communication port when the data communication port and the power output receptacle are coupled to an extension bar comprising a plurality of power outlets;
      select, based on the power information, a first power outlet of the plurality of power outlets of the extension bar; and
      send a command to the extension bar to change a state of the first power outlet to on or off, without changing a state of a second power outlet of the plurality of power outlets of the extension bar.

2. The UPS of claim 1, wherein the executable instructions that cause the processing resource to monitor power information further cause the processing resource is to monitor power delivered to the extension bar and delivered to each device coupled to the extension bar.

3. The UPS of claim 1, wherein the executable instructions further cause the processing resource to determine, based on the power information, power consumption of the extension bar and of each device coupled to the extension bar.

4. The UPS of claim 1, comprising:
a second power output receptacle; and
a plurality of second data communication port;
wherein executable instructions further cause the processing resource to:
   monitor second power information using the second data communication port when the second data communication port and the second power outlet receptacle are coupled to a second extension bar comprising a second plurality of power outlets;
   select, based on the second power information, a third power outlet of the second plurality of power outlets of the second extension bar; and
   send a second command to the second extension bar to change a state of the third power outlet to on or off, without changing a state of a fourth power outlet of the second plurality of power outlets of the second extension bar.

5. The UPS of claim 1, wherein the data communication port includes at least one of a serial port, an Ethernet port, an optical port, and a registered jack (RJ) port.

6. The UPS of claim 1, wherein the controller module is coupled to the power output receptacle and to the data communication port.

7. A method performed by a controller module of an uninterruptable power supply (UPS), the method comprising:
monitoring power delivered to each of a plurality of power output receptacles of a power outlet strip coupled to the UPS;
selecting, based on the monitoring, a first output receptacle of the plurality of output receptacles of the power outlet strip; and
sending a command to the power outlet strip to change a state of the first output receptacle to on or off, without changing a state of at least one of the remaining output receptacles of the plurality of output receptacles of the power outlet strip.

8. The method of claim 7, wherein monitoring the power delivered comprises determining power consumption of the power outlet strip and power consumption of each device coupled to the power outlet strip.

9. The method of claim 7, further comprising:
detecting when a device is coupled to the power outlet strip;
determining a type of the device; and
assigning a unique identification to the device.

10. A system, comprising:
an extension bar comprising:
a power inlet;
a plurality of power output receptacles; and
a first data communication port; and
an uninterruptible power supply (UPS), comprising:
a power outlet coupled to the power inlet of the extension bar;
a second data communication port coupled to the first data communication port of the extension bar; and
a controller module, comprising:
a processing resource; and
a memory resource coupled to the processing resource, the memory resource including executable instructions that, when executed by the processing resource, cause the processing resource to:
monitor power consumption of a plurality of computing devices each connected to one of the plurality of power output receptacles of the extension bar;
select, based on the monitored power consumption, a first power output receptacle to which a first computing device is connected; and
send a command to the extension bar to change a state of the first power output receptacle to on or off, without changing a state of at least one of the remaining power output receptacles of the plurality of power output receptacles of the extension bar.

11. The system of claim 10, wherein the executable instructions further cause the processing resource to:
detect when the first computing device couples to the first power output receptacle;
determine a type of the first computing device; and
assign a unique identification to the first computing device.

12. The UPS of claim 1, wherein the executable instructions further cause the processing resource to:
detect when a device is coupled to the first power outlet;
determine a type of the device; and
assign a unique identification to the device.

13. The UPS of claim 12, wherein the command is to change the state of the first power outlet to on.

14. The UPS of claim 1, wherein the executable instructions that cause the processing resource to monitor power information further cause the processing resource to monitor power consumption by a first device coupled to the first power outlet.

15. The method of claim 9, further comprising:
detecting that the device is coupled to the first output receptacle; and
wherein the command is to change the state of the first output receptacle to on.

16. The method of claim 7, further comprising:
monitoring power delivered to each of a second plurality of power output receptacles of a second power outlet strip coupled to the UPS;
selecting, based on the monitoring, a second output receptacle of the second plurality of output receptacles of the second power outlet strip;
send a second command to the second power outlet strip to change a state of the second output receptacle to on or off, without changing a state of at least one of the remaining output receptacles of the second plurality of output receptacles of the second power outlet strip.

17. The system of claim 11, wherein the command is to change the state of the first output receptacle to on.

18. The system of claim 10, further comprising:
a second extension bar comprising:
a second power inlet;
a second plurality of power output receptacles; and
a third data communication port; and
wherein the UPS, further comprising:
a second power outlet coupled to the second power inlet of the second extension bar;
a fourth data communication port coupled to the third data communication port of the second extension bar; and
wherein the executable instructions further cause the processing resource to:
monitor second power consumption of a second plurality of computing devices each connected to one of the second plurality of power output receptacles of the second extension bar;
select, based on the monitored second power consumption, a second power output receptacle to which a second computing device is connected; and
send a second command to the second extension bar to change a state of the second power output receptacle to on or off, without changing a state of at least one of the remaining power output receptacles of the second plurality of power output receptacles of the second extension bar.

19. The system of claim 10, further comprising a power cable coupling the power outlet and the power inlet, wherein the power cable comprises an International Electrotechnical Commission (IEC) standard power cable comprising a C19 power cable or a C13 power cable.

20. The system of claim 10, further comprising a communication cable coupling the first data communication port and the second data communication port, wherein the communication cable comprises at least one of a serial cable, an Ethernet cable, an optical cable, a twisted pair cable, or an RJ cable.

* * * * *